(12) United States Patent
Maruyama

(10) Patent No.: US 6,747,397 B2
(45) Date of Patent: Jun. 8, 2004

(54) STACKED TYPE ELECTRO-MECHANICAL ENERGY CONVERSION ELEMENT AND VIBRATION WAVE DRIVING APPARATUS USING THE SAME

(75) Inventor: Yutaka Maruyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 148 days.

(21) Appl. No.: 10/172,012

(22) Filed: Jun. 17, 2002

(65) Prior Publication Data

US 2002/0195906 A1 Dec. 26, 2002

(30) Foreign Application Priority Data

Jun. 25, 2001 (JP) .......................................... 2001-191264

(51) Int. Cl.⁷ ................................................ H01L 41/04
(52) U.S. Cl. ............. 310/328; 310/323.02; 310/323.12; 310/366
(58) Field of Search .................................. 310/328, 366, 310/323.02, 323.12, 323.16, 3

(56) References Cited

U.S. PATENT DOCUMENTS

| | | | |
|---|---|---|---|
| 5,594,291 A | 1/1997 | Tamai et al. ................. | 310/323 |
| 5,698,929 A | 12/1997 | Seki et al. ................... | 310/323 |
| 5,770,916 A * | 6/1998 | Ezaki et al. ................. | 310/366 |
| 5,814,919 A * | 9/1998 | Okumura ................ | 310/323.12 |
| 5,917,269 A | 6/1999 | Maruyama et al. .......... | 310/323 |
| 6,046,526 A | 4/2000 | Maruyama ............. | 310/323.06 |
| 6,051,911 A | 4/2000 | Kojima et al. ............... | 310/323 |
| 6,191,520 B1 | 2/2001 | Maruyama et al. .... | 310/323.06 |
| 6,559,574 B2 * | 5/2003 | Maruyama ............. | 310/323.02 |

* cited by examiner

Primary Examiner—Mark Budd
(74) Attorney, Agent, or Firm—Fitzpatrick, Cella, Harper & Scinto

(57) ABSTRACT

The present invention is to provide a stacked type electro-mechanical energy conversion element comprising a stack of superimposed layers with an electro-mechanical energy conversion function having an electrode film formed on a superimposed surface so as to improve the driving efficiency thereof. A part of the electrode film is connected to an electrode film formed on an edge portion of a layer, and on a side face of the stacked electro-mechanical energy conversion element, there are provided a connection terminal connectable to an external power supply, and a wiring portion connecting the connection terminal to the electrode film formed on the edge portion of the layer.

15 Claims, 7 Drawing Sheets

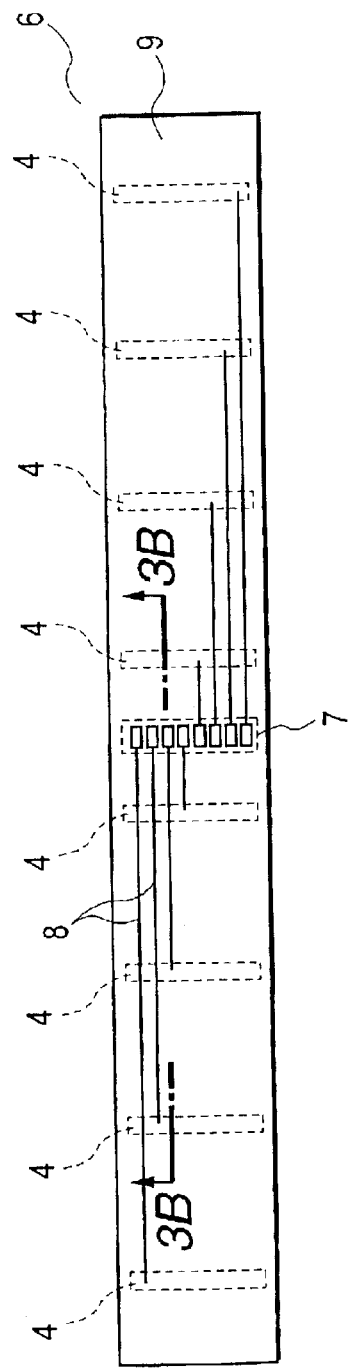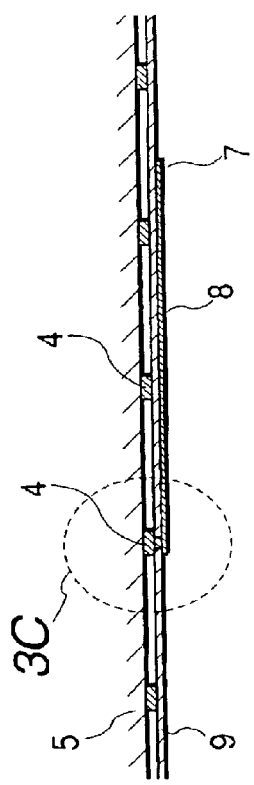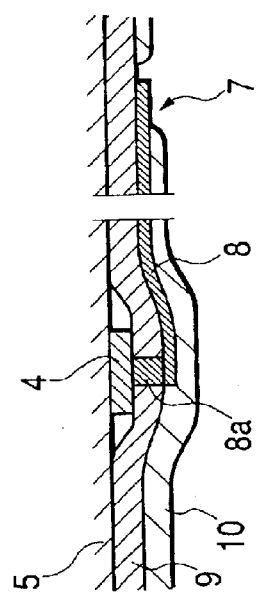
FIG. 3A
FIG. 3B
FIG. 3C

STACKED TYPE ELECTRO-MECHANICAL ENERGY CONVERSION ELEMENT AND VIBRATION WAVE DRIVING APPARATUS USING THE SAME

BACKGROUND OF THE INVENTION

1. Field of the Invention

The present invention relates to a stacked type electro-mechanical energy conversion element and a vibration wave driving apparatus of stacked structure consisting of a stack of a plurality of piezoelectric bodies and, more particularly, to a configuration for connecting electrodes between layers in the stacked type electro-mechanical energy conversion element.

2. Related Background Art

Piezoelectric elements having the electro-mechanical energy conversion function are used in various use applications. The piezoelectric elements are generally classified into the structure comprised of a single piezoelectric body of plate shape and the stacked structure comprised of multiple piezoelectric bodies of plate shape. The piezoelectric elements of the stacked structure can generate greater distortion with supply of a lower applied voltage than the piezoelectric elements of the structure comprised of only one piezoelectric body of plate shape.

A stacked type piezoelectric element is comprised of a plurality of piezoelectric layers of piezoelectric ceramics and electrode films (hereinafter referred to as internal electrodes) provided on surfaces of the respective piezoelectric layers. For connecting the internal electrodes on the respective piezoelectric layers to each other, it is common practice to provide electrode portions disposed on an outer peripheral surface or an inner peripheral surface of the stacked type piezoelectric element (hereinafter referred to as external electrodes), or to provide through holes along the stack direction in the piezoelectric layers and provide through electrodes (through holes) formed by burying an electrode material in the through holes.

FIGS. 5 and 6 show configurations of stacked type piezoelectric elements used in a vibration body of a rodlike vibration wave motor disclosed in U.S. Pat. No. 5,770,916.

The internal electrodes 103 indicated by hatching are formed on the surfaces of the second and lower piezoelectric layers 102 in the stacked type piezoelectric element 101 shown in FIG. 5. The internal electrodes 103 are not formed on the outer peripheral edges of the piezoelectric layers 102. In other words, the internal electrodes 103 are formed inside the outside diameter of the piezoelectric layers 102. Further, the internal electrodes 103 are out of contact with each other. Connection electrodes 103a (black solid portions in the drawing) are formed on the outer peripheral edges of the piezoelectric layers 102, and the connection electrodes 103a are in contact with the internal electrodes 103.

The internal electrodes 103 on the respective piezoelectric layers 102 are stacked so as to be aligned in identical phases, and the connection electrodes 103a are formed at identical positions on every other layer. Then the external electrodes 104 are formed at positions to be superimposed on the connection electrodes 103a, on the outer peripheral surface of the stacked piezoelectric element 101, so as to connect the connection electrodes 103a on every other layer. Namely, the internal electrodes 103 located in identical phases are arranged as electrically conductible on every other layer.

A plurality of surface electrodes 105 are provided along the circumferential direction and in the phases matched with those of the connection electrodes 103a, on the outer peripheral edge of the surface of the uppermost piezoelectric layer forming the stacked piezoelectric element 101. The surface electrodes 105 are connected to the external electrodes 104.

On the other hand, FIG. 6 shows another stacked piezoelectric element 201, in which the internal electrodes 203 are formed in structure similar to that shown in FIG. 5, on the surfaces of the piezoelectric layers 202 and in which the internal electrodes 203 are connected by the through electrodes (through holes) 204. The through electrodes 204 are exposed at their ends in the surface of the uppermost piezoelectric layer of the stacked piezoelectric element 201, thereby forming the surface electrodes 205.

Further, FIG. 7 shows an application example in which the aforementioned stacked piezoelectric element 101 of FIG. 5 is applied to the vibration body of the rodlike vibration wave motor. A wiring board 111 is kept in contact with the surface electrodes 105 of the stacked piezoelectric element 101, and the stacked piezoelectric element 101 and the wiring board 111 are placed between hollow metal members 21 and 22 of the vibration body. A bolt 23 penetrating a center hole of the stacked piezoelectric element 101 is inserted from the side of the metal member 22 to be screwed into the metal member 21. By tightening this bolt 23, the stacked piezoelectric element 101 and wiring board 111 are pinched and fixed between the two metal members 21 and 22. The wiring board 111 is connected to an unrepresented drive circuit and the drive circuit applies alternating voltages for driving, to the stacked piezoelectric element 101.

Likewise, in the case where the stacked piezoelectric element 201 shown in FIG. 6 is applied, the stacked piezoelectric element 201 and the wiring board 211 in contact with the surface electrodes 205 are also pinched and fixed between the metal members 21 and 22. The stacked piezoelectric element 201, which uses all the through electrodes as means for connecting the internal electrodes to each other, is incorporated into the vibration wave motor of the structure shown in FIG. 7, which is now under practical use as a driving source for driving a camera lens to effect autofocus.

The principle of driving of the rodlike vibration wave motor is as follows: a plurality of different bending vibrations with a temporal phase difference are generated in the vibration body equipped with the stacked piezoelectric element to force the distal end of the metal member 21 forming the vibration body, to perform a motion like a swinging motion. This motion rotates a rotor 24 kept in press contact with the metal member 21, through friction.

An example of the structure of the internal electrodes suitable for such driving is the quartered internal electrodes, as shown in FIGS. 5 and 6. Let us suppose that these internal electrodes are phase A, phase B, phase AG, and phase BG in the circumferential direction. Two internal electrodes located in the positional relation of 180° (phase A and phase AG; and phase B and phase BG) are polarized in directions different from each other. These phases A to BG are formed so as to be identical among the second and lower piezoelectric layers, and the internal electrodes of identical phases on the different layers are electrically connected to each other by the aforementioned external electrodes or through electrodes.

When with the phases AG and BG being ground a high-frequency voltage (alternating signal) having a frequency approximately equal to the natural frequency of the vibration body is applied to phase A and to phase B different 90° from the phase of phase A with a temporal phase difference between them, two bending vibrations perpendicular to each other are generated in the vibration body.

The method of interposing the stacked piezoelectric element 101, 201 and the wiring board 111, 211 between the metal members 21 and 22 as described above is high in reliability of electrical conduction between the stacked piezoelectric element 101, 201 and the wiring board 111, 211, and easy to assemble.

However, since the wiring board 111, 211 is interposed between the metal members forming the vibration body of the vibration wave motor, this wiring board 111, 211 causes damping of the vibrations. For this reason, there is conceivably plenty of scope for improvement in drive efficiency.

In addition, in the case of the stacked piezoelectric element 101 shown in FIG. 5, where the surface electrodes 105 are formed, for example, by inexpensive screen printing, the heights of the surface electrodes tend to become uneven. Therefore, more careful processing was needed.

The stacked piezoelectric element 201 shown in FIG. 6 required a system for forming the through electrodes and took a lot of processing time.

SUMMARY OF THE INVENTION

One of the features of the present invention is to provide a stacked type electro-mechanical energy conversion element comprising a stack of superimposed layers with an electro-mechanical energy conversion function having an electrode film formed on a superimposed surface, wherein part of the electrode film is connected to an electrode film formed on an edge portion of a layer, wherein on a side face of the stacked electro-mechanical energy conversion element there are provided a connection terminal connectable to an external power supply, and a wiring portion connecting the connection terminal to the electrode film formed on the edge portion of the layer.

When this stacked electro-mechanical energy conversion element is applied to a vibration wave driving apparatus, the alternating signals can be applied from the side to the stacked electro-mechanical energy conversion element, which can obviate the need for interposing a circuit board between an elastic member forming an vibration body and the stacked electro-mechanical energy conversion element.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3A is a development of a circuit board 6 of FIG. 1;

FIG. 3B is a sectional view along a line 3B—3B and in the direction indicated by arrows, of the circuit board 6 of FIG. 3A;

FIG. 3C is an enlargement of part 3C in FIG. 3B;

DESCRIPTION OF THE PREFERRED EMBODIMENTS

Figure 1:
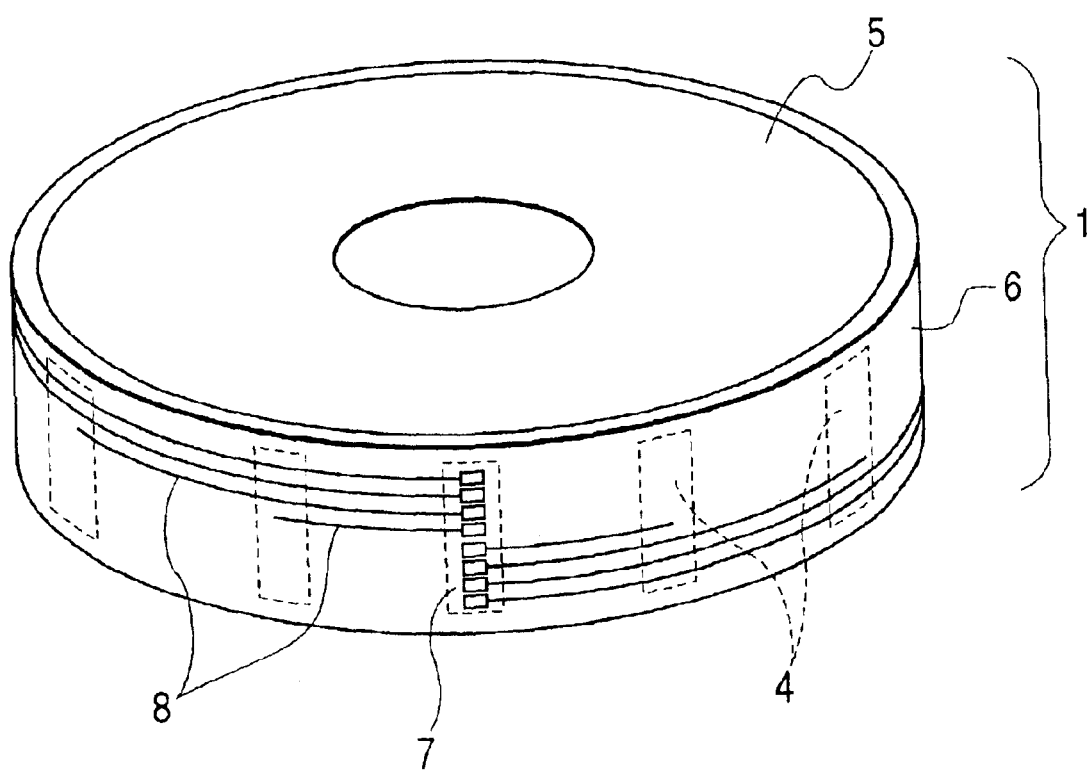
FIG. 1 is a perspective view showing the appearance of a stacked type piezoelectric element according to the present invention.

FIG. 1 is a perspective view showing the appearance of the stacked piezoelectric element 1 which is a stacked type electro-mechanical energy conversion element according to the present invention.

The stacked piezoelectric element 1 is comprised of a stacked piezoelectric body 5 of ring shape provided with a hole portion in the central region and a circuit board 6 constructed of a flexible printed board and as a wiring layer provided on the outer peripheral surface of the stacked piezoelectric body 5.

Figure 2:
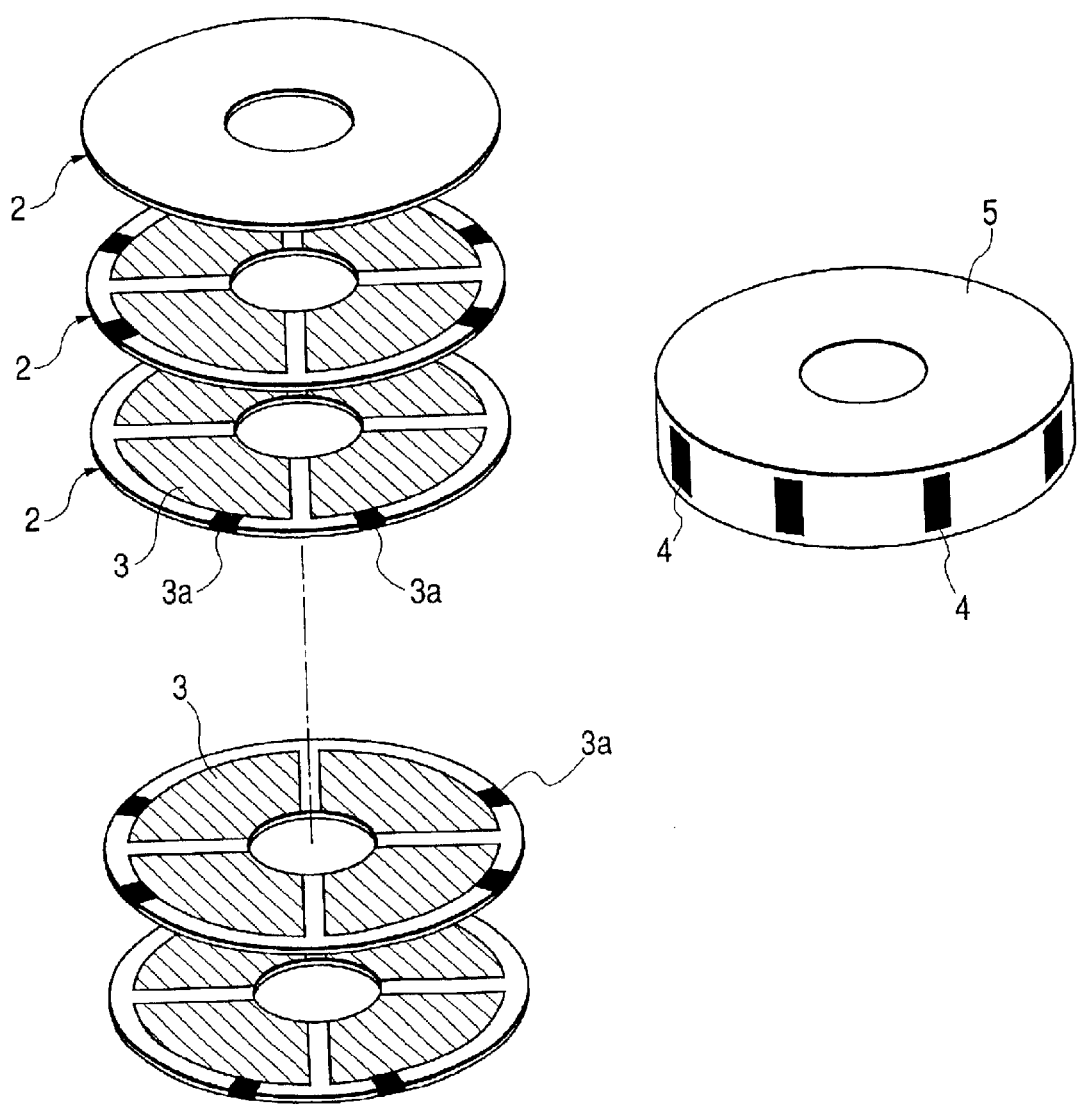
FIG. 2 is an exploded perspective view and an appearance perspective view of a stacked piezoelectric body 5 of FIG. 1.
Figure 5:
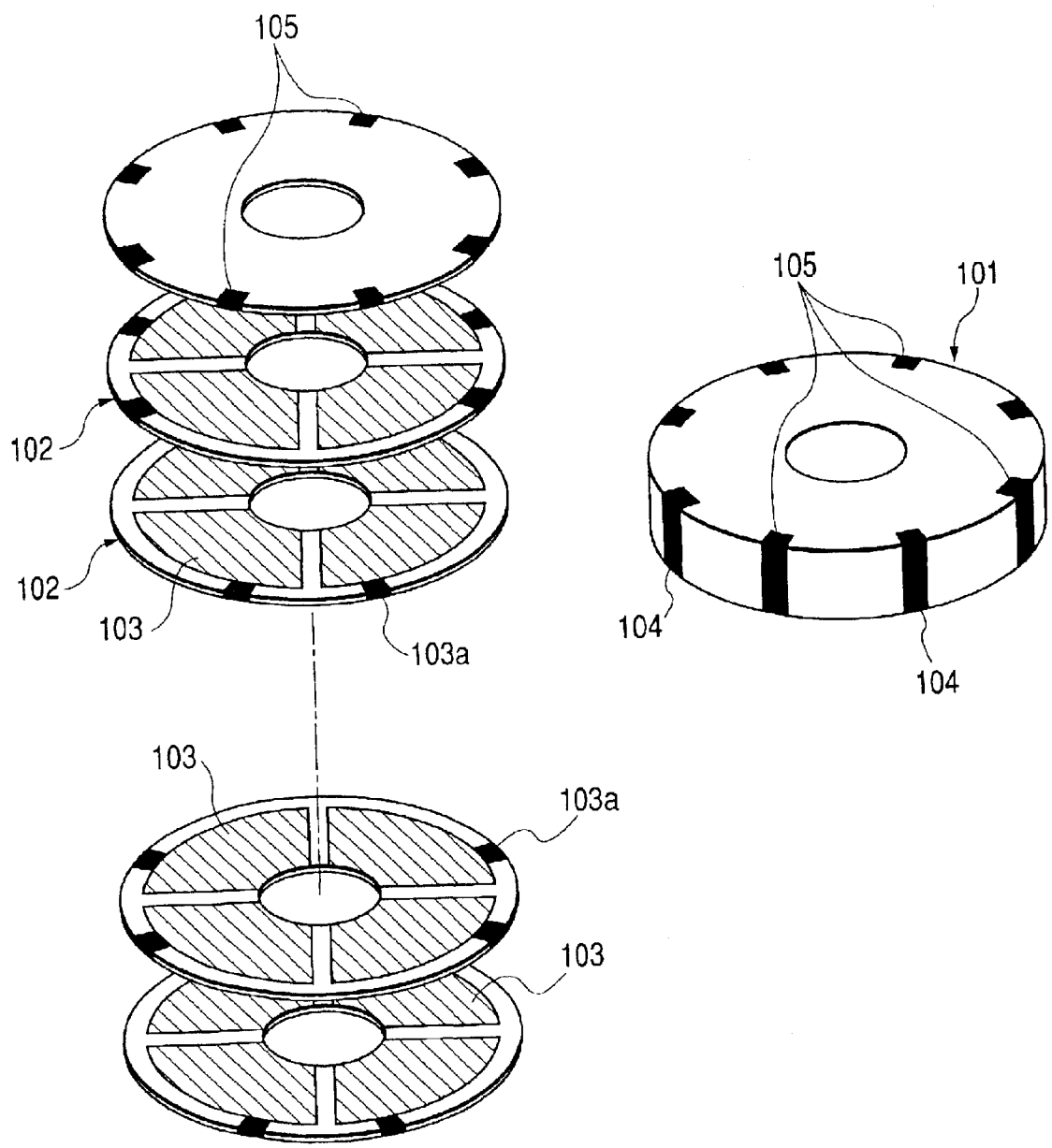
FIG. 5 is an exploded perspective view and an appearance perspective view of a conventional stacked type piezoelectric element.
Figure 6:
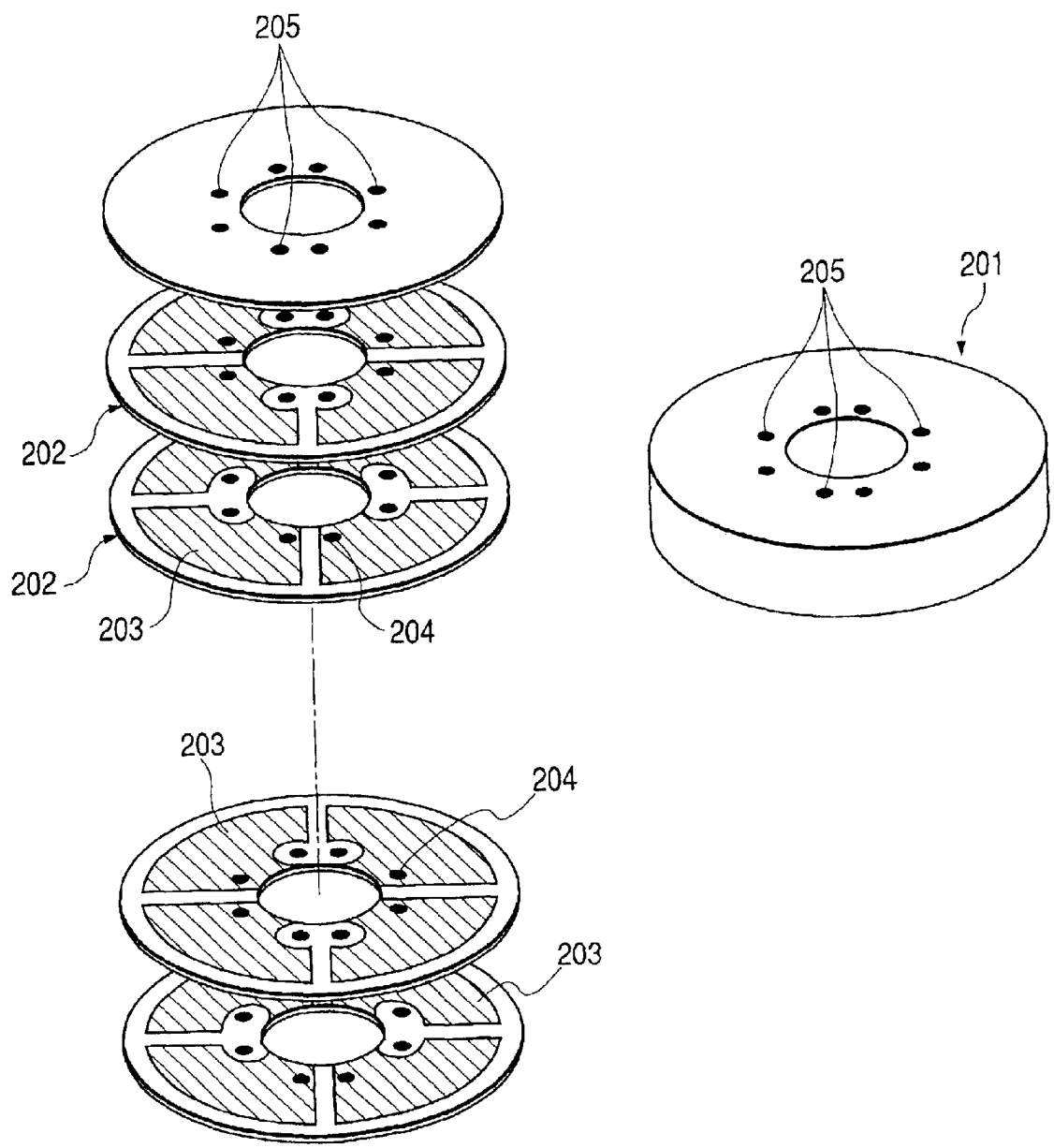
FIG. 6 is an exploded perspective view and an appearance perspective view of another conventional stacked type piezoelectric element.
Figure 7:
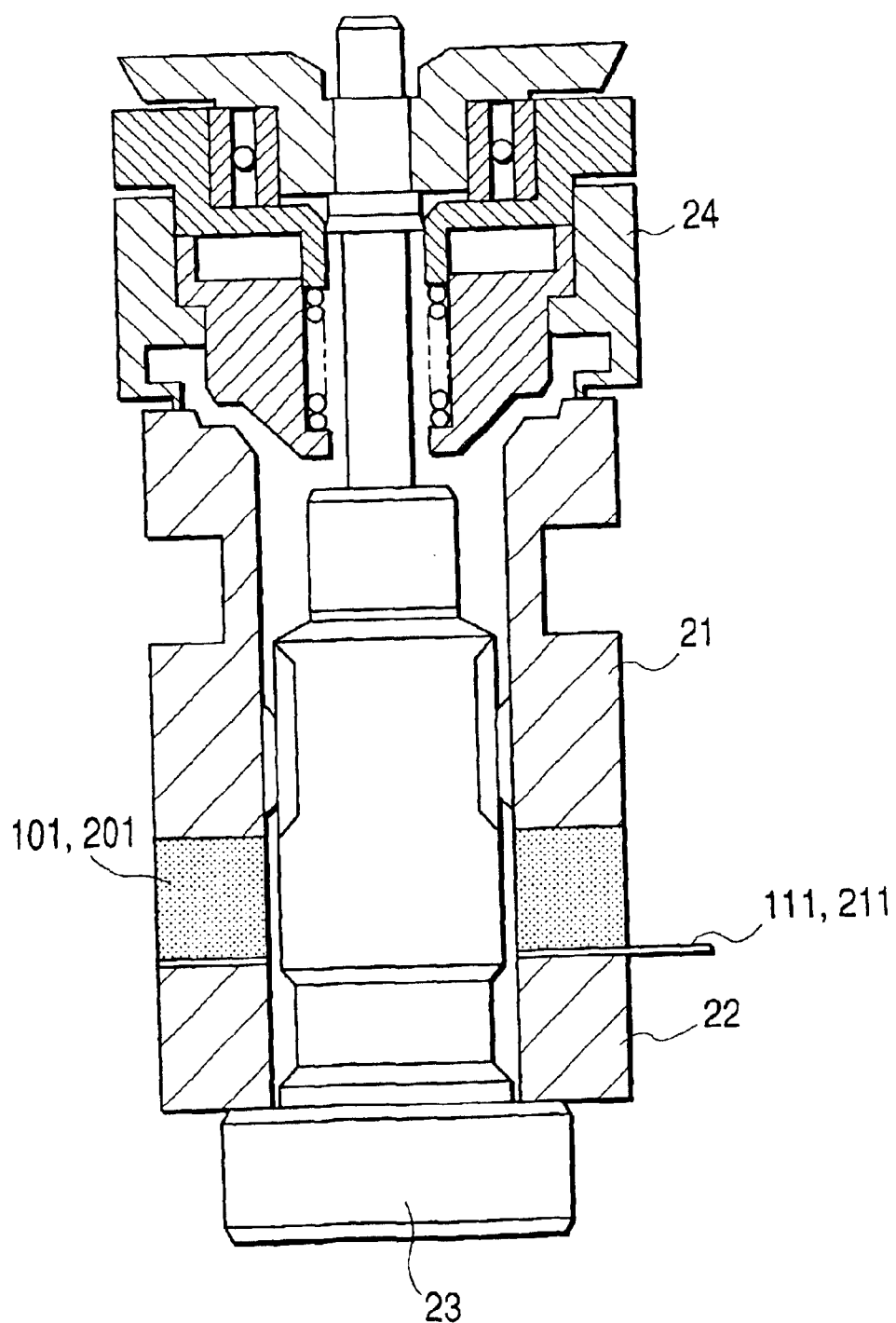
FIG. 7 is a sectional view of a vibration wave motor using the stacked piezoelectric element shown in FIG. 5 or 6.

FIG. 2 is an exploded perspective view of the stacked piezoelectric body 5. The second and lower piezoelectric layers 2 of the stacked piezoelectric body 5 are of the structure similar to that of the piezoelectric layers 102 shown in FIG. 5. The internal electrodes 3 of the quartered structure are formed on the surfaces of a plurality of piezoelectric layers 2. In other words, the piezoelectric layers 2 and the electrode films 3 are alternately superimposed in a stacked state. The number and shape of internal electrodes 3 are determined according to the number and mode of bending vibrations generated in the vibration wave motor, and thus the shape of the internal electrodes 3 is not limited to the quartered shape as shown in FIG. 2.

Further, the connection electrodes 3a (black solid portions in the drawing) connected to the respective internal electrodes 3 and extending to the outer peripheral edges of the piezoelectric layers 2 are formed on the surfaces of the piezoelectric layers 2. The connection electrodes 3a are formed in identical phases on every other layer, for example, with respect to the internal electrodes 3 of identical phases.

Then the connection electrodes 3a of identical phases are connected by the external electrodes 4 which are interlayer electrodes provided on the outer peripheral portion of the stacked piezoelectric body 5. Namely, the external electrodes 4 connect the connection electrodes 3a on every other layer. The two upper and lower end faces of the stacked piezoelectric body 5 are comprised of piezoelectric layers without the internal electrodes 3, and only the external electrodes 4 are in an electrically conductible state with the internal electrodes 3 through the connection electrodes 3a.

The external electrodes 4 extend in the stack direction of the stacked piezoelectric body 5, and in the present embodiment the external electrodes 4 are eight electrodes on the outer periphery of the stacked piezoelectric body 5.

Here the stacked piezoelectric body 5 employed in the present embodiment is one wherein the outside diameter is 6 mm, the inside diameter: 1.8 mm, the thickness: about 1.4 mm, the thickness of the piezoelectric layers 2:55 $\mu$m, the thickness of the internal electrodes 3:2 to 3 $\mu$m, and the number of piezoelectric layers 2:25. The external electrodes 4 have the length of about 1.35 mm, the width of about 1.5 mm, and the thickness of about 0.2 mm.

The following will describe a method of producing the stacked piezoelectric body 5. A silver-palladium powder paste for formation of the internal electrodes 3 was printed by screen printing on green sheets of piezoelectric ceramic powder and an organic binder for formation of the piezoelectric layers, and the sheets were superimposed in order and stacked under heat and pressure. Thereafter, the stack was baked at 1100° C.–1200° C. in a lead atmosphere. After the baking, the outer peripheral portion was machined, electrodes of silver with an adhesive were printed by screen printing to form the external electrodes, and they were hardened at about 80° C. Finally, a polarizing process was conducted to polarize the internal electrodes 3 in specific polarization directions for the respective electrode patterns.

FIG. 3A is a development of the circuit board 6 of FIG. 1, and FIG. 3B a sectional view thereof along the line 3B—3B and in the direction indicated by arrows in FIG. 3A.

A substrate 9 as a base of the circuit board 6 is made, for example, of a polyimide resin in the thickness of 30 μm. A plurality of wires 8 extending in the circumferential direction corresponding to the respective external electrodes 4 are formed on the outer peripheral side of the circuit board 6. These wires 8 are made, for example, of copper foil in the thickness of 25 μm, and are electrically connected to the external electrodes 4 through respective through electrodes 8a (through holes) penetrating the substrate 9 to be exposed on the inner peripheral side of the circuit board 6. These wires 8 are gathered to external terminals 7 provided on the outer peripheral side of the circuit board 6. The external terminals 7 are provided in the same number as the number of external electrodes 4 formed on the outer peripheral surface of the stacked piezoelectric body 5 and are arranged in a line along the stack direction.

One end of each of the wires 8 is electrically connected to an external terminal 7 different from those to which the other wires are connected, and the other end of each of the wires 8 is electrically connected to a through electrode 8a different from those to which the other wires are connected. The number of external terminals can be reduced by providing one wire 8 for each different alternating signal and connecting the external electrodes to which an identical alternating signal is applied, by an identical wire 8.

FIG. 3C is an enlargement of part 3C in FIG. 3B, which shows a configuration in which a cover coat 10 covers the outer peripheral surface of the circuit board 6. This cover coat 10 has electrically insulating nature and is provided over the entire outer peripheral surface except for the position of the external terminals 7. This ensures the electrical insulation for the outer peripheral surface except for the external terminals 7.

The circuit board 6 is flexible enough to be bent. While the through electrodes 8a and the external electrodes 4 are aligned with each other, the circuit board 6 is wound around the outer periphery of the stacked piezoelectric body 5, whereby electrical conduction is established between the external terminals 7 and the external electrodes 4. On that occasion, the stacked piezoelectric body 5 is fixed to the circuit board 6 with an adhesive and an electrically conductive adhesive is used for adhesion between the copper-plated through electrodes 8a and the external electrodes 4, which can ensure the electrical conduction between the external electrodes 4 and the external terminals 7.

As described above, in the case of the stacked piezoelectric element 1 shown in FIGS. 1, 2 and 3A to 3C, the circuit board 6 is fixed to the outer peripheral portion of the stacked piezoelectric body 5 and the connection between the unrepresented driving circuit and the stacked piezoelectric element 1 is allowed to be made only on the outer peripheral portion of the stacked piezoelectric element 1. This eliminates the need for interposing the wiring board between the metal members on the occasion of incorporating the stacked piezoelectric element into the vibration body of the vibration wave motor, different from the conventional structure. Namely, there occurs no damping of the vibrations due to the configuration wherein the circuit board is interposed between the metal members of the vibration body. The configuration of the present embodiment also eliminates stress on the circuit board due to the interposed configuration between the metal members, thereby enhancing the reliability of electrical connection between the stacked piezoelectric element and the driving circuit.

The above described the configuration in which the circuit board 6 preliminarily made of a polyimide sheet was wound around the outer peripheral portion of the stacked piezoelectric body 5, but it is also possible to form the circuit board in structure similar to the above, by forming the insulating and conductive layers on the outer peripheral surface (or inner peripheral surface) of the stacked piezoelectric body 5 by screen printing or the like with a resin paste and a metal paste.

The internal electrodes 3 shown in FIG. 2 are not in contact with the outer peripheral edges of the piezoelectric layers 2, but it is noted that the shape of the internal electrodes 3 is not limited to this. The internal electrodes 3 may be formed in other shape as long as the electrodes (the internal electrodes 3 and the connection electrodes 3a) to which the different alternating signals are applied are electrically insulated from each other.

It is, however, necessary to secure the electrical insulation at the outer peripheral edges except for the external electrodes 4, for example, by the substrate 9 of polyimide.

Figure 4:
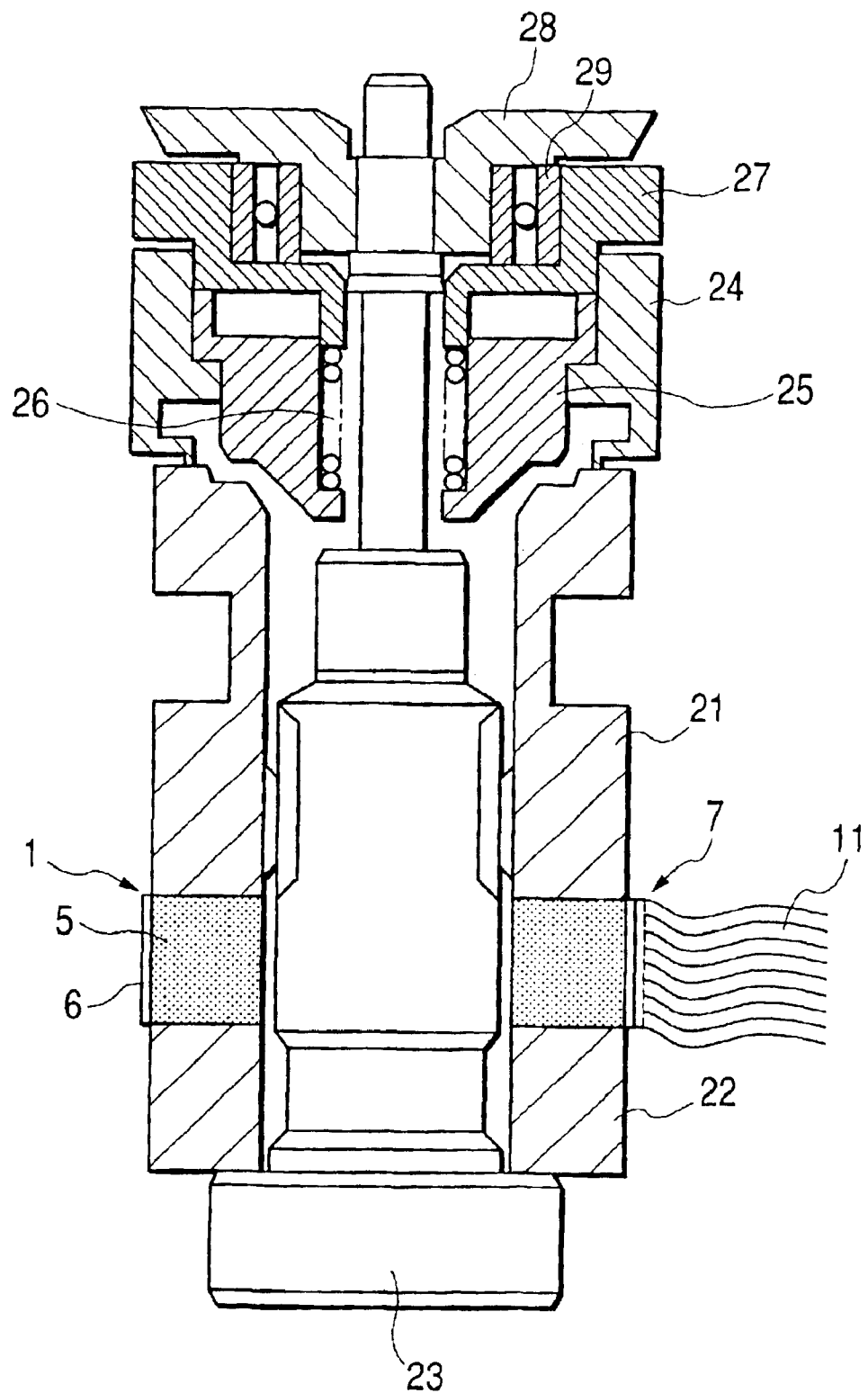
FIG. 4 is a sectional view of a vibration wave motor using the stacked piezoelectric element of FIG. 1.

FIG. 4 is a sectional view of a rodlike vibration wave motor of structure wherein a rodlike vibration body is constructed using the stacked piezoelectric element 1 shown in FIGS. 1, 2 and 3A to 3C and a rotor is rotationally driven by the vibration body.

Only the stacked piezoelectric element 1 is placed between cylindrical metal members. A bolt 23 with a distal end of smaller diameter is inserted through a metal member 22 of an elastic member, the stacked piezoelectric element 1, and a metal member 21 of an elastic member as well in order, so that a screw part of the bolt 23 is screwed into a screw portion formed in the inside circumference of the metal member 21. By tightening this bolt 23, the stacked piezoelectric element 1 is pinched and fixed between the metal members 21 and 22.

Since the through electrodes and surface electrodes are not formed on the layers at the ends of the stacked piezoelectric element 1, surface flatness is ensured there, so that the stacked piezoelectric element 1 is securely pinched and fixed between the metal members.

A flat cable or flexible circuit board 11 is soldered to the external terminals 7 of this stacked piezoelectric element 1 to connect the circuit board 11 to the unrepresented driving circuit. The driving circuit generates alternating signals and applies the alternating signals through the external terminals 7 to the internal electrodes 3 of the stacked piezoelectric element 1.

One end face of the metal member 21 serves as a driving portion, and a contact portion of rotor (moving body) 24 is in press contact with the driving portion. This contact portion of the rotor 24 has elasticity both in the axial direction and in the radial direction. A spring retainer 25 is provided in the internal peripheral portion of the rotor 24 and a spring 26 is placed in the inner peripheral portion of the spring retainer 25. The rotor 24 is placed so as to rotate around the center of rotation at the distal end portion of the bolt 23 formed in the smaller diameter.

The spring retainer 25 rotates together with the rotor 24 and transmits the spring force of the spring 26 to the rotor 24 to keep the contact portion of the rotor 24 in press contact with the driving portion of the metal member 21.

The spring retainer 25 engages with an output member 27 which is a gear to rotate together with the rotor 24. The spring retainer 25 and the output member 27 are arranged as juxtaposed in the axial direction, and their engaging portions are not regulated in the thrust direction, but are regulated in the rotational direction.

The output member 27 has a projection for receiving the spring 26, in an inside diameter portion and thus also serves as a member for receiving the reaction force of the spring 26.

A securing member 28 for securing the vibration wave motor to an unrepresented mount portion is coupled to the distal end of the bolt 23. The output member 27 is rotatably attached to a bearing 29 mounted on the outer peripheral portion of this securing member 28.

As described above, the use of the stacked piezoelectric element 1 shown in FIGS. 1, 2 and 3A to 3C eliminates the need for interposing the circuit board for applying the driving signals to the stacked piezoelectric element, between the metal member and the stacked piezoelectric element. Namely, since the stacked piezoelectric element 1 is directly interposed between the two metal members 21 and 22, damping is very little in the vibrations of the vibration body of the rodlike vibration wave motor, which can enhance the performance of the motor.

The vibration wave motor may be any other motor than the rodlike vibration wave motor described above. For example, it can be the vibration wave motor with the known vibration body wherein the stacked piezoelectric element is bonded to one side of a metal elastic body of ring shape or disk shape. In the case of the stacked piezoelectric element used in this vibration wave motor, the external electrodes 4 may be provided on the inner peripheral portion of the hollow stacked piezoelectric body 5. In this case, the circuit board 6 is also placed on the inner peripheral portion of the stacked piezoelectric body 5.

What is claimed is:

1. A stacked type electro-mechanical energy conversion element comprising:
   a plurality of superimposed layers having an electro-mechanical energy conversion function, wherein an electrode film is formed on a surface between the superimposed layers and wherein part of the electrode film is connected to an electrode film formed on an edge portion of a layer;
   a connection terminal which is provided on a side face of the stacked type electro-mechanical energy conversion element and which is arranged as connectable to an external power supply; and
   a wiring portion which is provided on the side face of the stacked type electro-mechanical energy conversion element and which is arranged to connect the electrode film formed on the edge portion of the layer, to the connection terminal.

2. A stacked type electro-mechanical energy conversion element comprising:
   a plurality of superimposed layers having an electro-mechanical energy conversion function, wherein an electrode film is formed on a surface between the superimposed layers and wherein part of the electrode film is connected to an electrode film formed on an edge portion of a layer;
   an external electrode which connects electrode films formed on edge portions of different layers, to each other;
   a connection terminal which is provided on a side face of the stacked type electro-mechanical energy conversion element and which is arranged as connectable to an external power supply; and
   a wiring portion which is provided on the side face of the stacked type electro-mechanical energy conversion element and which is arranged to connect the external electrode to the connection terminal.

3. A stacked type electro-mechanical energy conversion element according to claim 2, wherein layers at two ends are layers having no electrode film.

4. A stacked type electro-mechanical energy conversion element according to claim 2, wherein a plurality of electrode films are formed on a surface between the superimposed layers and wherein the external electrode connects electrode films formed in an identical phase on a plurality of layers, to each other.

5. A stacked type electro-mechanical energy conversion element according to claim 4, wherein a film of the external electrode connects electrode films formed on edge portions of predetermined layers.

6. A stacked type electro-mechanical energy conversion element according to claim 4, wherein said wiring portion is formed on a surface of an insulating layer formed on the side face of the stacked type electro-mechanical energy conversion element and is connected to the external electrode by an electrode penetrating said insulating layer.

7. A stacked type electro-mechanical energy conversion element according to claim 6, wherein said wiring portion formed on the surface of the insulating layer is further covered by an insulating layer.

8. A vibration wave driving apparatus for inducing vibration with supply of a plurality of alternating signals, comprising:
   a vibration body including a stacked type electro-mechanical energy conversion element to which the plurality of alternating signals are applied, and an elastic body to which the stacked type electro-mechanical energy conversion element is fixed; and
   a moving body kept in contact with the vibration body and driven by vibration induced in a surface of the vibration body,
   wherein said stacked type electro-mechanical energy conversion element comprises:
      a plurality of superimposed layers having an electro-mechanical energy conversion function, in which an electrode film is formed on a surface between the superimposed layers and in which part of the electrode film is connected to an electrode film formed on an edge portion of a layer;
      a connection terminal which is provided on a side face of the stacked type electro-mechanical energy conversion element and which is arranged as connectable to an external power supply; and
      a wiring portion which is provided on the side face of the stacked type electro-mechanical energy conversion element and which is arranged to connect the electrode film formed on the edge portion of the layer, to the connection terminal.

9. A vibration wave driving apparatus for inducing vibration with supply of a plurality of alternating signals, comprising:
   a vibration body including a stacked type electro-mechanical energy conversion element to which the plurality of alternating signals are applied, and an elastic member to which the stacked type electro-mechanical energy conversion element is fixed; and a moving body kept in contact with the vibration body and driven by vibration induced in a surface of the vibration body, wherein said stacked type electro-mechanical energy conversion element comprises:
- a plurality of superimposed layers having an electro-mechanical energy conversion function, in which an electrode film is formed on a surface between the superimposed layers and in which part of the electrode film is connected to an electrode film formed on an edge portion of a layer;
- an external electrode which connects electrode films formed on edge portions of different layers, to each other;
- a connection terminal which is provided on a side face of the stacked type electro-mechanical energy conversion element and which is arranged as connectable to an external power supply; and
- a wiring portion which is provided on the side face of the stacked type electro-mechanical energy conversion element and which is arranged to connect the external electrode to the connection terminal.

10. A vibration wave driving apparatus according to claim 9, wherein layers at two ends of said stacked type electro-mechanical energy conversion element are layers having no electrode film.

11. A vibration wave driving apparatus according to claim 9, wherein a plurality of electrode films are formed on a surface between the superimposed layers of said stacked type electro-mechanical energy conversion element and wherein the external electrode connects electrode films to which an identical alternating signal is applied, on a plurality of layers, to each other.

12. A vibration wave driving apparatus according to claim 11, wherein said wiring portion of said stacked type electro-mechanical energy conversion element has a plurality of wires and each wire connects external electrodes to which an identical alternating signal is applied.

13. A vibration wave driving apparatus according to claim 11, wherein said wiring portion of said stacked type electro-mechanical energy conversion element has wires in the same number as the number of external electrodes.

14. A vibration wave driving apparatus according to claim 9, wherein said wiring portion of the stacked type electro-mechanical energy conversion element is formed on an insulating layer formed on the side face of the stacked type electro-mechanical energy conversion element and is connected to the external electrode by an electrode penetrating said insulating layer.

15. A vibration wave driving apparatus according to claim 14, wherein said wiring portion formed on the surface of the insulating layer of said stacked type electro-mechanical energy conversion element is further covered by an insulating layer.

* * * * *